United States Patent

Newman et al.

[11] Patent Number: 5,126,533
[45] Date of Patent: Jun. 30, 1992

[54] SUBSTRATE HEATER UTILIZING PROTECTIVE HEAT SINKING MEANS

[75] Inventors: Nathan Newman, Montara; Kookrin Char, Palo Alto, both of Calif.

[73] Assignee: Conductus, Inc., Sunnyvale, Calif.

[21] Appl. No.: 494,738

[22] Filed: Mar. 19, 1990

[51] Int. Cl.$^5$ .................. H01L 21/203; H05B 3/18
[52] U.S. Cl. .................. 219/385; 219/200; 219/541; 219/540; 219/461; 219/462; 439/487; 439/485
[58] Field of Search ........ 219/385, 200, 228, 254–255, 219/443, 455, 457, 521, 541, 544, 243, 245, 258, 458, 461–464, 530–531, 540; 118/725; 432/233, 231, 214; 174/16.3; 439/487, 485; 361/386, 388

[56] References Cited

U.S. PATENT DOCUMENTS

| | | | |
|---|---|---|---|
| 1,257,106 | 2/1918 | Parkhurst | 219/457 |
| 1,378,324 | 5/1921 | Clark et al. | 219/464 |
| 1,677,005 | 7/1928 | Reichold | 219/345 |
| 2,290,901 | 7/1942 | Weinhardt et al. | 219/461 |
| 3,382,477 | 5/1968 | Peterson | 439/487 |
| 3,396,361 | 8/1968 | Sussman | 439/487 |
| 3,627,590 | 12/1971 | Mammel | 118/62 |
| 4,417,347 | 11/1983 | Muka et al. | 219/354 |
| 4,593,168 | 6/1986 | Amada | 219/10.55 M |
| 4,703,154 | 10/1987 | Ikegami et al. | 219/345 |
| 4,743,570 | 5/1988 | Lamont, Jr. | 437/248 |

FOREIGN PATENT DOCUMENTS

| | | | |
|---|---|---|---|
| 63-216987 | 6/1988 | Japan | 118/725 |
| 63-241921 | 10/1988 | Japan | 118/725 |

OTHER PUBLICATIONS

RCA Technical Note #837, "Substrate Heater", May 16, 1969.

Primary Examiner—M. H. Paschall
Assistant Examiner—John A. Jeffery
Attorney, Agent, or Firm—Marvin E. Jacobs

[57] ABSTRACT

A substrate heater for the production of superconducting films utilizing a nickel alloy block uniformly heated with a resistance heating element fully immersed in a brazing material that fills a recess in the block. Massive electric power connectors surround the heating element leads outside the braze material so as to provide a protective heat sink therefor and also to mechanically strengthen the block against warpage.

7 Claims, 1 Drawing Sheet

SUBSTRATE HEATER UTILIZING PROTECTIVE HEAT SINKING MEANS

TECHNICAL FIELD

This invention relates to the field of processing and manufacturing high temperature superconductive (HTSC) films for use in electronic devices. More specifically, a substrate heater is disclosed for supporting and heating, to very close parameters, the substrate materials upon which superconducting films are grown.

BACKGROUND OF THE INVENTION

Superconducting materials for electronic devices may be created by forming films of suitable high temperature superconducting compounds on the surfaces of suitable substrate materials. The techniques are similar to those long used in the production of semiconductor films.

Precursors of the superconducting material are vaporized in a vacuum chamber by sputtering, ion beam sputtering, laser evaporation, electron beam heating or the like. The precursor materials travel through space to be deposited on a suitable substrate, usually chosen to encourage epitaxial growth of the HTSC material in a desired crystalline arrangement. The temperature of the substrate must be carefully controlled and this is achieved by mounting the substrate on some type of heating device. Many such substrate heaters are known in the semiconductor processing arts. However, the requirements of producing HTSC materials are far more demanding than those of making semiconductors. HTSC processing requires utilization of very high vacuums to reduce the chance for any high temperature equipment to cool itself which is also common in semiconductor processing. However, most currently known HTSC compounds require the introduction of oxygen in a very controlled way, at elevated temperatures and pressures. Thus, the substrate heater is exposed to a very strong oxidizing environment. The fabrication of good quality HTSC films requires very uniform heating of the substrate with variations of less than 2 degrees centigrade across the wafer even while operating at overall temperatures in the area of 900 degrees centigrade.

Precise control of the operating temperature is necessary since it is only in an optimum range of temperatures that the fine balance of several competing processes is maintained that determines the crystallization of the structure and the uptake of oxygen into the growing films. If conditions are not exactly controlled, contamination may result from reaction and interdiffusion between the substrate and the growing film. If the balance is not sustained, it can adversely affect the superconducting transition temperature, the width of the transition to zero resistance, and the critical current density. Prior art heaters have not as yet met these criteria.

STATEMENT OF THE PRIOR ART

Examples of prior art substrate heaters may be had by reference to Mammel U.S. Pat. No. 3,627,590, Muka et al. U.S. Pat. No. 4,417,347, Amada U.S. Pat. No. 4,593,168 or Lamont Jr. U.S. Pat. No. 4,743,570. Mammel shows a substrate heated by infrared radiation. The substrate is supported on a layer of flowing gas to insulate it from the surrounding structure. This design is significantly different from the present invention. Muka also advocates radiant heating for uniformity (column 5, line 46) but the disconnected filament wire taught by Muka would heat the substrate in too variable a manner for HTSC applications. Amada proposes electromagnetic wave heating resulting in a much different structure than the instant invention. Finally, Lamont proposes to use gas conduction heat transfer (column 17, line 28). None of these prior art approaches solve the problems addressed by the present invention.

BRIEF SUMMARY OF THE INVENTION

The new and novel design contemplated by this invention uses an electrical resistance heating element brazed directly into a pocket in a massive heating block. The heating block not only achieves intimate contact with the heating element, but it provides good conduction of heat over the block body for very uniform distribution and protects the heating element from the corrosive environment.

The design allows insertion of a heat measuring thermocouple directly into the heat block for highly accurate monitoring of the temperature during film growth. In addition, massive electrical contacts are provided that both physically stabilize the heating block against warpage and also provide a heat sink connection to the heating element to protect against overheating of the exposed portions of the heating element. The present invention permits very uniform heating of the substrate material at a measurable and consistent temperature. Enhanced yields of good high temperature superconducting products have been demonstrated. The heater is, at once, compatible, with a vacuum environment, an inert gas environment, and a corrosive high pressure, high temperature, oxygen environment. More benefits and advantages will become apparent upon consideration of the following drawings and detailed description.

DETAILED DESCRIPTION OF THE INVENTION

Figure 1:
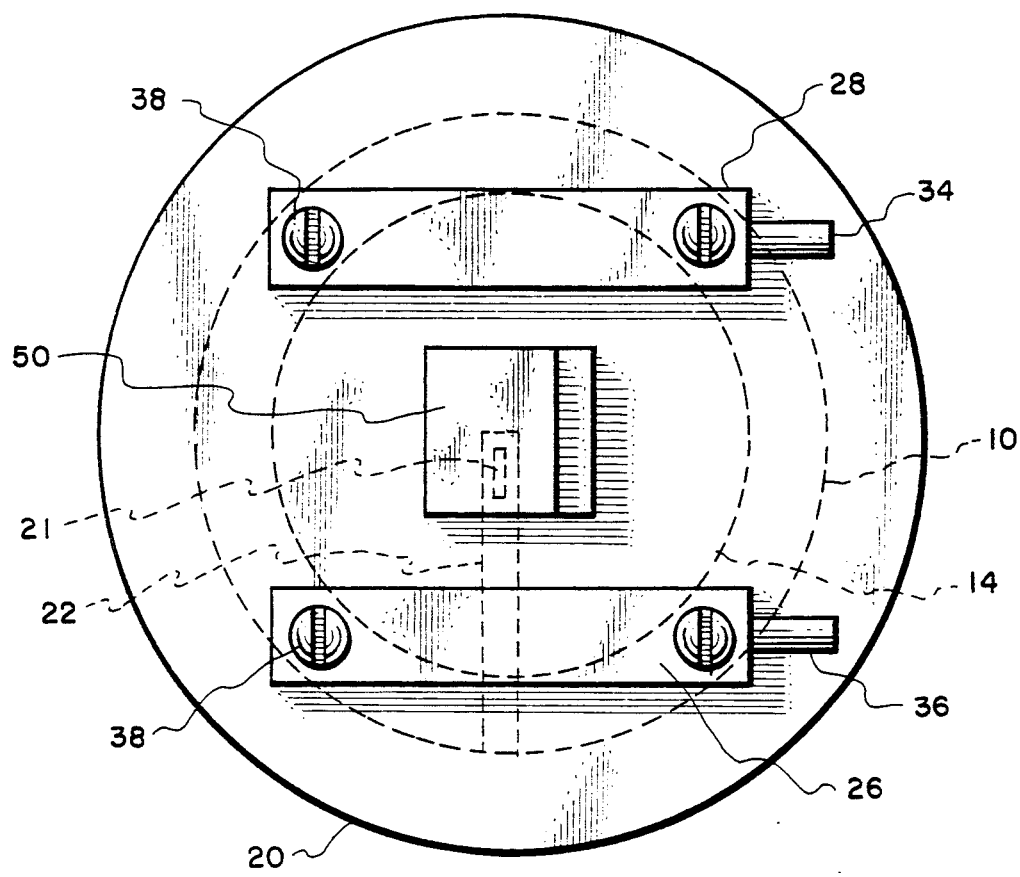
FIG. 1 is a first view of the substrate heater.

Reference to both Figures will show a solid, comparatively massive heating block 10, that is generally disk shaped, having a flat surface 12 upon which the substrate material is mounted. Block 10 is partly cut away at location 11 in FIG. 2 to better show the interior construction thereof. The substrate is held in place with suitable clips or an adhesive in a manner well known to those skilled in the art. A circular indentation or pocket 14 is formed into block 10. Contained in pocket 14 is a resistance heating element 16 of which only a small portion is visible in the cut away part of FIG. 2. Element 16 comprises a nichrome wire insulated with a magnesium oxide coating in the preferred embodiment. Such a wire is preferred to tungsten, which may be too brittle, or molybdenum which can burn in the oxygen environment.

Block 10 is preferably constructed from a stable, thermally conductive, environment compatible metal such as nickel. The preferred embodiment uses an alloy of nickel, chrome, iron, aluminum, and yttrium commonly known as Haynes alloy no. 214. To insure good heat transfer into block 10, element 16 is brazed into pocket 14 with a brazing material 18 formed from nickel, silicon, and chrome in the preferred embodiment. Wire element 16 is disposed generally in a repetitive pattern that fills all parts of pocket 14. This pattern comprises a double spiral in the preferred embodiment, but clearly other patterns are suitable as well. Element 16 is immersed in the brazing material 18 so as to be protected against the vacuum chamber environment and further protected from localized overheating. The combination of the braze material 18 and block 10 forms a solid uniform substrate heater of good conductivity through which heat from element 16 quickly disperses. To counter the inherent edge effects caused by radiation of heat away from block 10, a cup shaped cylindrical heat reflector 20 is disposed about block 10 so as to reflect the escaping radiant energy back to block 10 and thus keep block 10 at a uniform temperature across its face 12.

Exact monitoring of the temperature is achieved by inserting a thermocouple heat measuring device 21 into a hole 22 in block 10. Such a design is advantageous in that intimate internal positioning of the thermocouple in block 10 results in a more accurate measurement of the substrate material temperature. This is very important in producing high quality HTSC films.

Most of element 16 is well protected inside braze material 18. However, two small leads 24 rise above braze 18 in order to connect electric power to element 16. If these leads are too long, or are used directly for connections, they will get very hot and fail. To overcome this problem the present invention incorporates a pair of heat sink connectors 26 and 28. As visible in FIG. 2, lead 24 of element 16 is inserted deep into hole 30 in connector 26 as shown by dashed line 25. Lead 24 is clamped in place by a set screw 32. Connectors 26 and 28 are formed from a strong, protective material, stainless steel in the preferred embodiment, giving the same heat sink protection to the narrow element leads 24 as block 10 gives to element 16. The other lead, of course, enters a similar hole in connector 28. Larger connection lugs 34 and 36 provide power connection points for larger and hence more durable wires.

Figure 2:
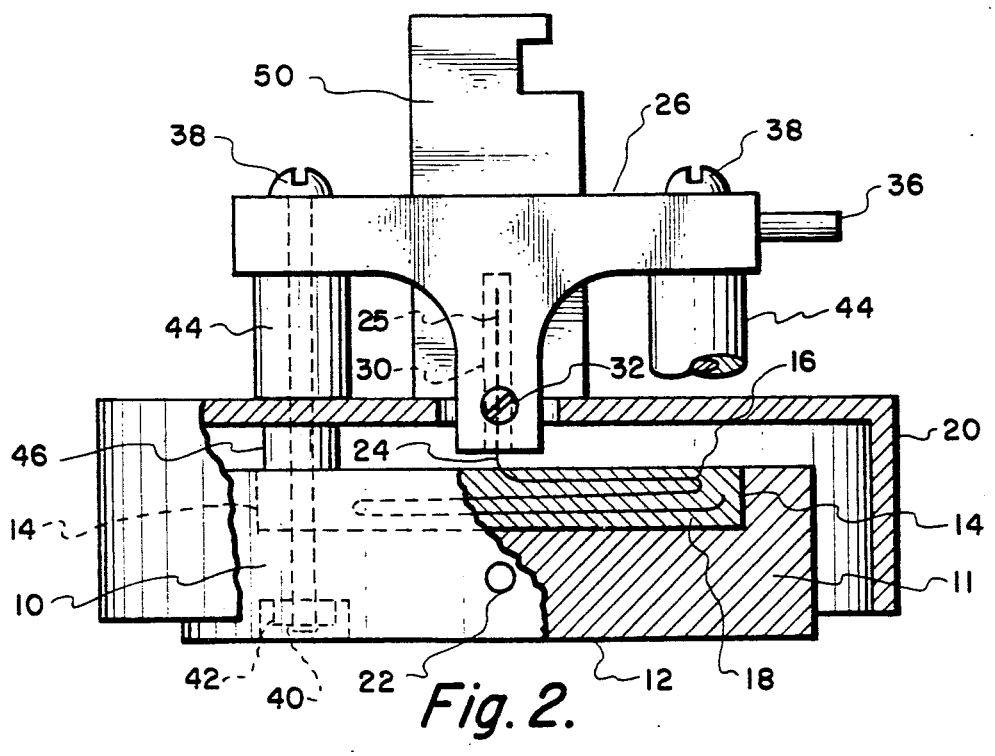
FIG. 2 is a side view of the FIG. 1 structure with some portions cut away to show the design more clearly.

Four screws 38 hold connectors 26 and 28 to block 10 and reflector 20, best observed in FIG. 2 where a recessed nut 40 in a hole 42 is fastened to the end of one of the screws 38. All four screws are similarly connected with four ceramic spacers 44 between connectors 26, 28 and reflector 20. Four additional ceramic spacers 46 are held between block 10 and reflector 20. As a result, the connectors 26 and 28 are mechanically well anchored to reflector 20 and block 10 establishing a combined rigidity in the structure to defend against thermal movements of substrate mounting surface 12.

A support member 50, shown only schematically in the drawings, is mounted to reflector 20 to permit physical mounting of the substrate heater inside a vacuum chamber.

It should be noted that the heater is very rugged in construction with the delicate leads 24 fully heat protected as well as mechanically supported. Unlike prior art constructions, this heater may be easily handled without fear of breakage or altering the heating results. Many variations in specific structural details will be apparent to those skilled in the art and therefore we intend limitation only in accordance with the appended claims.

We claim;

1. A substrate heater comprising:
   a thermally conductive heater block having a working face adapted to receive thereon a substrate material and further having a pocket on the side opposite said working face;
   a resistive heating element brazed to said heater block in said pocket on the side opposite to said working face with a brazing material that substantially surrounds said element so as to protect said element and conduct heat from said element uniformly to said block:
   heat sink connector means rigidly mounted on said block, said connector means having openings therein adapted top receive and surround the end portions of said element substantially over most of the end portions that protrude from the brazing material so as to protect said end portions and conduct heat away from said end portions, said connector means comprising a pair of heat sink members, each of which has a center part with one of said openings therein and end parts on either side of said center part, said end parts having fasteners therethrough the connect the heat sink members to said heater block;
   first ceramic spacers between said end parts and said heater block; and
   radiation reflecting means positioned about all sides of said heater block except said working face so as to reflect back radiation from said heater block.

2. The heater of claim 1 in which said radiation reflecting means is positioned and secured between said first ceramic spacers and second ceramic spacers, said second ceramic spacers positioned against said heater block.

3. The heater of claim 2 in which said fasteners through end parts of said heat sink members also pass through said first ceramic spacers, said reflecting means, and said second ceramic spacers.

4. The heater of claim 1 in which said heater block is formed of a nickel alloy.

5. The heater of claim 3 in which said heater block is formed of a nickel alloy.

6. The heater of claim 1 in which said heat sink connector means comprise stainless steel.

7. The heater of claim 5 in which said heat sink members are formed from stainless steel.

* * * * *